(12) United States Patent
Redaelli

(10) Patent No.: US 11,716,861 B2
(45) Date of Patent: Aug. 1, 2023

(54) ELECTRICALLY FORMED MEMORY ARRAY USING SINGLE ELEMENT MATERIALS

(71) Applicant: Micron Technology, Inc., Boise, ID (US)

(72) Inventor: Andrea Redaelli, Milan (IT)

(73) Assignee: Micron Technology, Inc., Boise, ID (US)

( * ) Notice: Subject to any disclaimer, the term of this patent is extended or adjusted under 35 U.S.C. 154(b) by 164 days.

(21) Appl. No.: 17/122,464

(22) Filed: Dec. 15, 2020

(65) Prior Publication Data

US 2022/0190032 A1 Jun. 16, 2022

(51) Int. Cl.
*H10B 63/00* (2023.01)
*G11C 13/00* (2006.01)
*H10N 70/00* (2023.01)
*H10N 70/20* (2023.01)

(52) U.S. Cl.
CPC ....... *H10B 63/845* (2023.02); *G11C 13/0004* (2013.01); *H10N 70/023* (2023.02); *H10N 70/041* (2023.02); *H10N 70/066* (2023.02); *H10N 70/231* (2023.02);
(Continued)

(58) Field of Classification Search
CPC ..... H01L 27/249; H01L 45/06; H01L 45/144; H01L 45/1616; H01L 45/1641; H01L 45/1683; H01L 45/1226; H01L 45/16; G11C 13/004; G11C 2013/0083; G11C 2213/71; H10B 63/845; H10N 70/023; H10N 70/041; H10N 70/066; H10N 70/231; H10N 70/8828; H10N 70/011; H10N 70/823

See application file for complete search history.

(56) References Cited

U.S. PATENT DOCUMENTS 7,727,884 B2 6/2010 Bae et al.
7,902,048 B2 3/2011 Shin et al.
9,214,630 B2 12/2015 Xiao et al.
(Continued)

FOREIGN PATENT DOCUMENTS

KR 20080035864 A 4/2008

OTHER PUBLICATIONS

International Search Report and Written Opinion from related International Patent Application No. PCT/US2021/063526, dated Apr. 1, 2022, 8 pages.
(Continued)

*Primary Examiner* — Jerome Leboeuf
(74) *Attorney, Agent, or Firm* — Brooks, Cameron & Huebsch, PLLC

(57) ABSTRACT

Electrically formed memory arrays, and methods of processing the same are described herein. A number of embodiments include a plurality of conductive lines separated from one other by an insulation material, a first plurality of conductive extensions arranged to extend substantially perpendicular to the plurality of conductive lines, a storage element material formed around each respective one of the first plurality of conductive extensions, a second plurality of conductive extensions arranged to extend substantially perpendicular to the plurality of conductive lines, and a plurality of single element materials formed around each respective one of the second plurality of conductive extensions.

13 Claims, 6 Drawing Sheets

(52) U.S. Cl.
CPC . *H10N 70/8828* (2023.02); *G11C 2013/0083* (2013.01); *G11C 2213/71* (2013.01)

(56) References Cited

U.S. PATENT DOCUMENTS

| | | | |
|---|---|---|---|
| 9,437,815 | B1 | 9/2016 | Kwan |
| 10,308,673 | B2 | 6/2019 | Pore et al. |
| 2006/0172067 | A1 | 8/2006 | Ovshinsky et al. |
| 2013/0009122 | A1 | 1/2013 | Park et al. |
| 2014/0361239 | A1* | 12/2014 | Ramaswamy ...... H01L 27/2418 257/5 |
| 2015/0255511 | A1 | 9/2015 | Takagi et al. |
| 2016/0087009 | A1 | 3/2016 | Mieno |
| 2016/0104748 | A1* | 4/2016 | Ravasio .............. H01L 27/2481 257/4 |
| 2016/0122868 | A1 | 5/2016 | Kim et al. |
| 2017/0271408 | A1* | 9/2017 | Yang ..................... H01L 45/146 |
| 2018/0337329 | A1* | 11/2018 | Gealy ................. H01L 27/2481 |
| 2019/0371857 | A1 | 12/2019 | Ando et al. |
| 2021/0184118 | A1* | 6/2021 | Li ....................... H01L 27/2463 |

OTHER PUBLICATIONS

Adinolfi, et al., "Atomic layer deposition of germanium-selenium-tellurium compounds for low-leakage, tunable ovonic threshold switches", Journal of Vacuum Science & Technology A, Apr. 24, 2020, <avs.scitation.org/journal/iva>, 5 pages.

* cited by examiner

ELECTRICALLY FORMED MEMORY ARRAY USING SINGLE ELEMENT MATERIALS

TECHNICAL FIELD

The present disclosure relates generally to semiconductor memory and methods, and more particularly, to electrically formed memory arrays.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

One of a number of data states (e.g., resistance states) can be set for a resistive memory cell. For example, a single level memory cell (SLC) can be programmed to a targeted one of two different data states, which can be represented by the binary units 1 or 0 and can depend on whether the cell is programmed to a resistance above or below a particular level. As an additional example, some resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1:
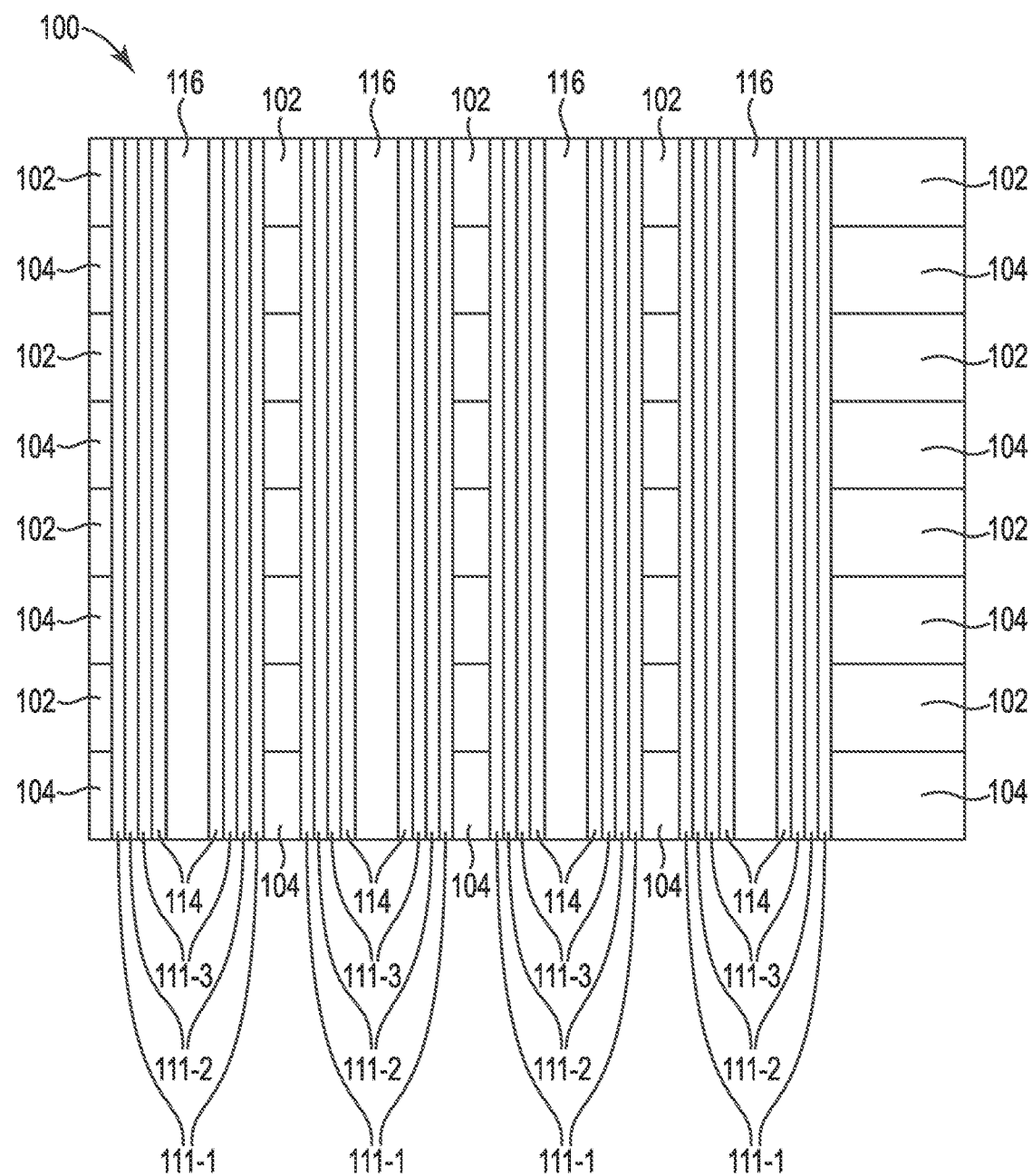
FIG. 1 illustrates a schematic cross-sectional view of a processing step associated with electrically forming a memory array in accordance with an embodiment of the present disclosure.

The present disclosure includes electrically formed memory arrays, and methods of processing the same. A number of embodiments include a plurality of conductive lines separated from one other by an insulation material, a first plurality of conductive extensions arranged to extend substantially perpendicular to the plurality of conductive lines, a storage element material formed around each respective one of the first plurality of conductive extensions, a second plurality of conductive extensions arranged to extend substantially perpendicular to the plurality of conductive lines, and a plurality of single element materials formed around each respective one of the second plurality of conductive extensions.

Memory arrays in accordance with the present disclosure include select device material. Select device material can comprise chalcogenide material. Chalcogenide materials used in memory arrays can include a plurality of elements (e.g., as an alloy). For instance, chalcogenide materials can include a combination of two or more of: selenium (Se), indium (In), arsenic (Ar), antimony (Sb), tellurium (Te), silicon (Si), and/or germanium (Ge), among others. Previous approaches to forming memory arrays may be insufficiently able to perform certain techniques (e.g., atomic layer deposition (ALD)) with chalcogenide materials, particularly those with greater quantities of elements therein. This is due, for instance, to the chemical nature of ALD and the difficulty involved in identifying appropriate precursors and/or chemical reactions for a desired chalcogenide material. Instead, chalcogenide materials exceeding a particular quantity of elements (e.g., 3) tend to be deposited using other techniques in previous approaches, such as physical vapor deposition (PVD), which is less complicated by chemistry.

However, some memory array architectures call for more conformal deposition of select device material than processes such as PVD allow. Additionally, PVD may provide insufficient aspect ratios for certain applications. In accordance with the present disclosure, memory arrays with chalcogenide materials are formed using the highly conformal deposition technique of ALD. In some embodiments, for instance, constituent single elements of a desired chalcogenide material are deposited via ALD individually. The order of the deposition, as well as the relative thicknesses of the constituent elements, can be selected based on the desired resulting formation. Once deposited, the single-element materials can undergo an electrical forming process. A voltage can be applied via a bit line and a word line during the electrical forming process. In some embodiments, the voltage (or voltages) is applied via a plurality of electrical pulses. In various embodiments, the amplitude, duration, slope, and/or polarity of the pulses can be selected based on the elements deposited and the desired resulting formation. During the electrical forming process the temperature of each memory cell of the memory array can rise to exceed a temperature at which ions of the single element materials move and/or mix, which may be referred to herein as a "mixing temperature." For example, memory cells may reach 1000 degrees Celsius during the electrical forming process. The density of current through the cells in combination with the elevated temperature can cause a chalcogenide material to form from the individually deposited single-element materials.

The term "single element material" refers to a material comprised of a single chemical element irrespective of chemical impurities. Examples of single element materials include selenium (Se), indium (In), arsenic (Ar), antimony (Sb), tellurium (Te), silicon (Si), and/or germanium (Ge), among others. It is noted that while the present disclosure discusses the deposition of single element materials, such discussion is not meant to be taken in a limiting sense. For example, in some embodiments, materials comprised of more than one element (e.g., binary alloys) are deposited in accordance with the processes described herein. Stated differently, the term "single-element material" can refer to a material comprised of one or two elements.

Additionally, it is noted that the present disclosure discusses embodiments herein in the context of three-dimensional memory arrays. However, such discussion is not meant to be taken in a limiting sense; those of ordinary skill in the art will readily appreciate that embodiments of the present disclosure can be implemented in architectures not specifically indicated herein, including two-dimensional or planar memory arrays, for instance.

As used herein, "a" or "an" can refer to one or more of something, and "a plurality of" can refer to more than one of such things. For example, a memory cell can refer to one or more memory cells, and a plurality of memory cells can refer to two or more memory cells.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1A, and a similar element may be referenced as 202 in FIG. 2A.

FIG. 1 illustrates a schematic cross-sectional view of a processing step associated with electrically forming a memory array (referred to as 100 in FIG. 1) in accordance with an embodiment of the present disclosure.

As shown in FIG. 1, the array 100 includes a conductive line material 102 which can be deposited in a plurality of planes vertically separated from one other by an insulation material 104. For instance, the insulation material 104 can be formed over an etch stop (e.g., substrate) material (not shown in FIG. 1), a first conductive line material 102 can then be formed on the insulation material, additional insulation material 104 can then be formed on the first conductive line, a second conductive line material 102 can then be formed on the insulation material that was formed on the first conductive line material, additional insulation material 104 can then be formed on the second conductive line material, and the formation of conductive line material 102 and insulation material 104 can continue in such an alternating manner.

Each respective one of the plurality of planes can be at (e.g., form) a different level of the three dimensional memory array, such as, for instance, a different elevation, deck, tier, or plane (e.g., electrode plane) of the array. For example, each respective conductive line material 102 can be a different access line (e.g., word line) of the array. Conductive line material 102 can comprise (e.g., be formed of) a metallic (or semi-metallic) material or a semiconductor material such as a doped polysilicon material, among others. Although four levels are shown in the embodiment illustrated in FIG. 1, embodiments of the present disclosure are not limited to this quantity. Insulation material 104 can be, for example, a dielectric material, such as, for instance, silicon oxide.

A plurality of openings (e.g., vias or holes) can be formed (e.g., etched and/or patterned) through the alternating insulation material 104 and conductive line material 102. For example, the plurality of openings can be formed through the conductive line material 102 such that at least a portion of each respective opening passes through each respective conductive line material 102. By forming the openings, portions of conductive line material 102 can be removed such that the resulting area of conductive line material 102 may exclude the area removed in forming the openings. Each of the plurality of openings can be formed at the same time. For instance, each of the plurality of openings can be formed in a single etch and/or pattern using a single mask.

In some embodiments, different ones of openings can be formed in different shapes and/or sizes. For example, openings that are formed adjacent (e.g., along) two opposite sides of array 100 can be rectangular shaped, and the remaining openings formed therebetween can be square shaped. However, embodiments of the present disclosure are not limited to a particular shape(s) and/or size(s) for openings. For example, circular, oval, and/or angled shaped openings, among others, may be formed, with sharp or rounded corners.

As shown in FIG. 1, each of the plurality of openings can be filled by forming (e.g., depositing) a plurality of single-element materials (referred to generally herein as "single element materials 111") in each respective opening, then forming a conductive cylinder (e.g., tube) 114 in each respective opening in contact with (e.g., over) one of the single element materials that was formed therein, and then forming a conductive extension 116 in each respective opening in contact with (e.g., over) the conductive cylinder 114 that was formed therein, such that the single element materials are concentrically formed around conductive cylinder 114, which is concentrically formed around conductive extension 116. For instance, as used herein, "concentric" can refer to structures that are substantially surrounding each other in any shape, including circular, oval, or rectangular shapes, for instance.

The single element materials 111 include a first single element material 111-1, a second single element material 111-2, and a third single element material 111-3. It is noted that while three single element materials 111 are shown in the example illustrated in FIG. 1, embodiments of the present disclosure are not so limited. The first single element material 111-1 is shown as being deposited first, followed by the second single element material 111-2 and the third single element material 111-3.

Any of the single element materials 111 can be a constituent element of a chalcogenide material. For instance, any of the single element materials 111 can be a selenium material, a tellurium material, a germanium material, an arsenic material, an indium material, an antimony material, and/or a silicon material, among others. The single element materials can be deposited via ALD. The order of the deposition, as well as the relative thicknesses of the single element materials 111, can be stoichiometrically selected and/or determined based on the desired chalcogenide formation (discussed further below). In some embodiments the respective thicknesses of the single element materials 111 are equal. In other embodiments, the respective thicknesses of the single element materials 111 differ.

Although not shown in FIG. 1 for clarity and so as not to obscure embodiments of the present disclosure, in some instances a portion of the single element materials 111 and a portion of the conductive cylinder 114 may also form on (e.g., cover) the bottom of each respective opening when the single element materials 111 and the conductive cylinder 114 are deposited therein. Further, although not shown in FIG. 1, addressable access lines may be present below the array 100.

In various embodiments, the array 100 is subjected to an electrical forming process. In some embodiments, a voltage is applied via a data line and an access line (discussed further below) during the electrical forming process. In some embodiments, a voltage or a plurality of different voltages are applied via a plurality of electrical pulses. Various characteristics of the plurality of pulses can be controlled to render a desired resulting chalcogenide material. For instance, the amplitude, duration, slope, and/or polarity of the pulses can be selected based on the elements deposited and the desired resulting formation. During the electrical forming process the temperature of the single element materials 111 can rise to exceed a threshold temperature. Such a temperature is referred to as a mixing temperature and refers to a temperature at or above which ions of the single element materials 111 move and/or mix. For example, the single element materials 111 may exceed 1000 degrees Celsius during the electrical forming process. The density of current through the single element materials 111 in combination with the elevated temperature can cause a chalcogenide material (referred to below as "storage element material 212") to form from the individually deposited single-element materials 111.

Figure 2:
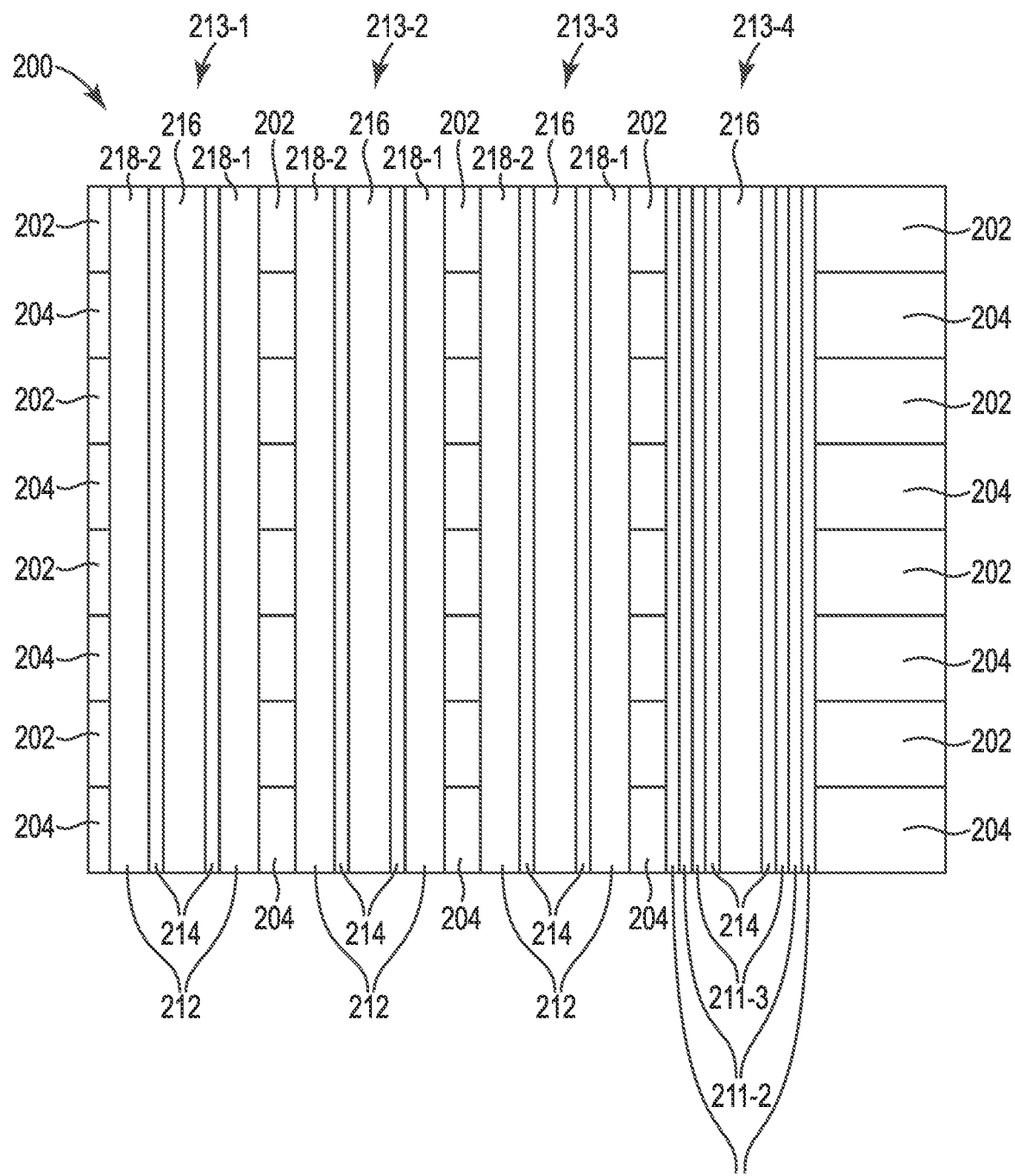
FIG. 2 illustrates a schematic cross-sectional view of a memory array in accordance with an embodiment of the present disclosure.

FIG. 2 illustrates a schematic cross-sectional view of a memory array (referred to as 200 in FIG. 2) in accordance with an embodiment of the present disclosure. For instance, FIG. 2 illustrates the array of FIG. 1 after the performance of an electrical forming process as described herein.

As shown in FIG. 2, a storage element material 212 has been formed from the single element materials 111, previously described in connection with FIG. 1. The storage element material 212, the conductive cylinder 214, and the conductive extension 216 formed in each respective opening are arranged to extend substantially perpendicular to the conductive lines 202. As such, the storage element material 212, conductive cylinder 214, and conductive extension 216 formed in each respective opening can comprise a vertical stack of the array 200. That is, the array 200 can include a plurality of vertical stacks (cumulatively referred to as "stacks 213"), wherein each respective stack 213 on which electrical forming was performed includes a storage element material 212 and a conductive cylinder 214 concentrically formed around a conductive extension 216, as illustrated in FIG. 2.

As shown in FIG. 2, electrical forming has been performed on a first stack 213-1, a second stack 213-2, and a third stack 213-3. A fourth stack 213-4 has been omitted in the electrical forming process. As such, the fourth stack 213-4 still retains the single element materials 211. The fourth stack 213-4 may be located at a periphery and/or an edge of the array 200. In some embodiments, electrical forming may not be performed on any stacks located along an edge or a periphery of an array and those stacks may not be utilized as memory cells.

In the stacks 213 on which electrical forming has been performed, storage element material 212 is formed between a conductive extension 216 and a first conductive line 202, and also between the conductive extension 216 and a second conductive line 202, wherein the second conductive line is coplanar with, but electrically decoupled from, the first conductive line 202. Conductive cylinder 214 may be present between either of storage element material 212 and conductive extension 216.

Figure 5:
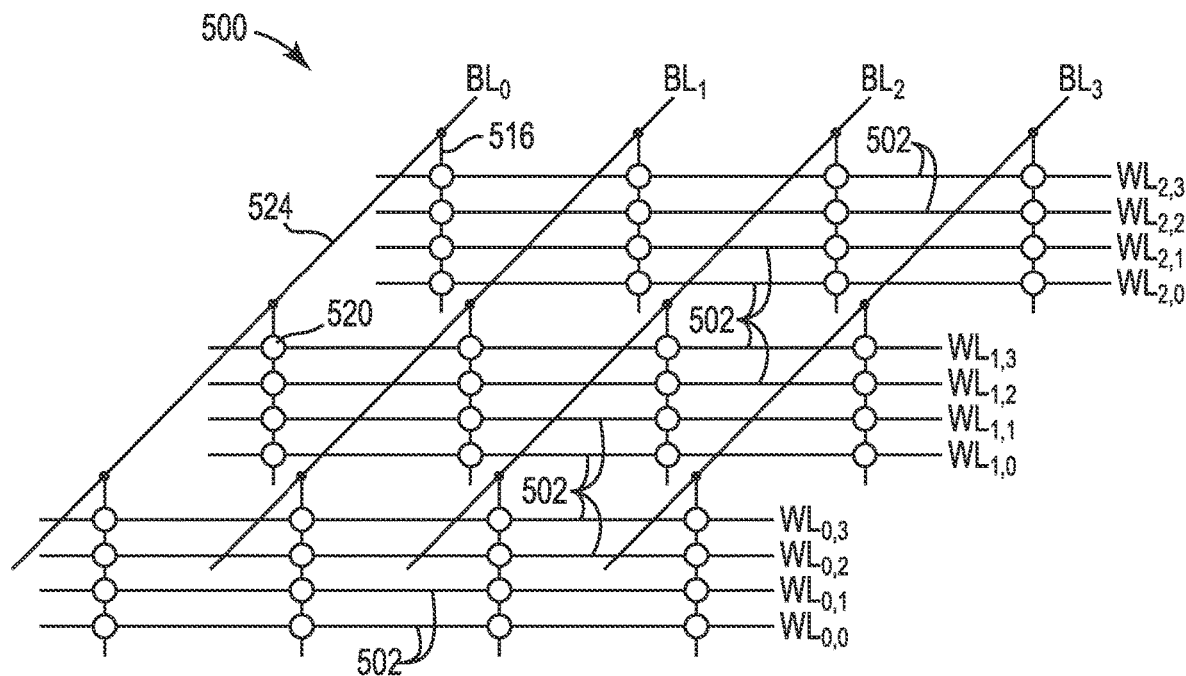
FIG. 5 illustrates a three dimensional memory array in accordance with an embodiment of the present disclosure.

Each respective conductive extension 216 can be a pillar communicatively coupled at one end to a different data (e.g., bit) line, as will be further described herein (e.g., in connection with FIG. 5). Each respective conductive extension 216 can comprise a metallic material, such as, for example, tungsten. For instance, each respective conductive extension 216 can comprise a different metallic material than the plurality of conductive lines 202, though embodiments of the present disclosure are not so limited.

The conductive cylinder 214 concentrically formed around each respective conductive extension 216 can be, for example, an electrode cylinder. The conductive cylinder 214 can comprise a metallic (or semi-metallic) material or a semiconductor material such as a doped polysilicon material, among others, which can be the same material as the plurality of conductive lines 202, for instance. However, other metallic, semi-metallic, or semiconductor materials can be used.

As previously discussed, the storage element material 212 concentrically formed around each respective conductive cylinder 214 and conductive extension 216 can be a chalcogenide material, such as a chalcogenide alloy and/or glass, that can serve as a self-selecting storage element material (e.g., that can serve as both a select device and a storage element). For example, storage element material 212 (e.g., the chalcogenide material) can be responsive to an applied voltage, such as a program pulse, applied thereto. For an applied voltage that is less than a threshold voltage, storage element material 212 may remain in an "off" state (e.g., an electrically nonconductive state). Alternatively, responsive to an applied voltage that is greater than the threshold voltage, storage element material 212 may enter an "on" state (e.g., an electrically conductive state). Further, the threshold voltage of storage element material 212 in a given polarity may change based on the polarity (e.g., positive or negative) of the applied voltage. For instance, the threshold voltage may change based on whether the program pulse is positive or negative.

Examples of chalcogenide materials produced by single element deposition and electrical forming that serve as storage element material 212 include germanium(Ge) telluride(Te) materials, indium(In) telluride(Te) materials, indium(In)-antimony(Sb)-tellurium(Te) (IST) materials, such as $In_2Sb_2Te_5$, $In_1Sb_2Te_4$, $In_1Sb_4Te_7$, etc., and germanium(Ge)-antimony(Sb)-tellurium(Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. The hyphenated chemical composition notation, as used herein, indicates the elements included in a particular mixture or compound, and is intended to represent all stoichiometries involving the indicated elements.

In some embodiments, the storage element material 212 is chemically uniform. In other embodiments, the storage element material 212 varies across its thickness. For example, incomplete mixing during the electrical forming process may render a gradient between different single element materials 211.

As shown in FIG. 2, the storage element material 212 concentrically formed around conductive cylinder 214 and conductive extension 216 in each respective opening (e.g., the storage element material 212 of each respective vertical stack of array 200) can have two different contacts (e.g., contacts 218-1 and 218-2) with each respective one of the plurality of conductive lines 202 at two different ends of that respective conductive line.

As shown in FIG. 2 the two different contacts 218-1 and 218-2 of each respective storage element material 212 with each respective conductive line 202 can be separated from one another by insulation material 204. For instance, contact 218-1 can be on one side of storage element material 212, contact 218-2 can be on the opposite side of storage element material 212, and the remaining two sides of storage element material 212 (as well as a portion of the sides of storage element material 212 that include contacts 218-1 and 218-2) can be in contact with insulation material 204, as illustrated in FIG. 2. As such, the two different contacts 218-1 and 218-2 of each respective storage element material 212 with each respective conductive line 202 can be non-continuous (e.g., separate) contacts that can be separately selectable and/or addressable, as will be further described herein.

Although not shown in FIG. 1 or 2 for clarity and so as not to obscure embodiments of the present disclosure, other materials may be formed before, after, and/or between storage element material 212, conductive cylinder 214, and/or conductive extension 216, for example to form adhesion layers or barriers against interdiffusion of materials and/or to mitigate undesired composition mixing. Further, in some examples, array 200 may not include conductive cylinder 214 (e.g., conductive cylinder 214 may not be formed in each respective opening), such that conductive extension 216 may directly contact storage element material 212. Further, in the embodiment illustrated in FIG. 2, any portion of storage element material 212, conductive cylinder 214, and conductive extension 216 that may have formed above the uppermost insulation material 204 has been removed, to isolate each respective conductive extension 216 (e.g., each respective pillar) from each other. This can be done by, for example, etching and/or chemical-mechanical polishing (CMP). Further, in some examples, conductive cylinder 214 may be optional (e.g., in such examples, no conductive cylinder may be formed between storage element material 212 and conductive extension 216).

Figure 3:
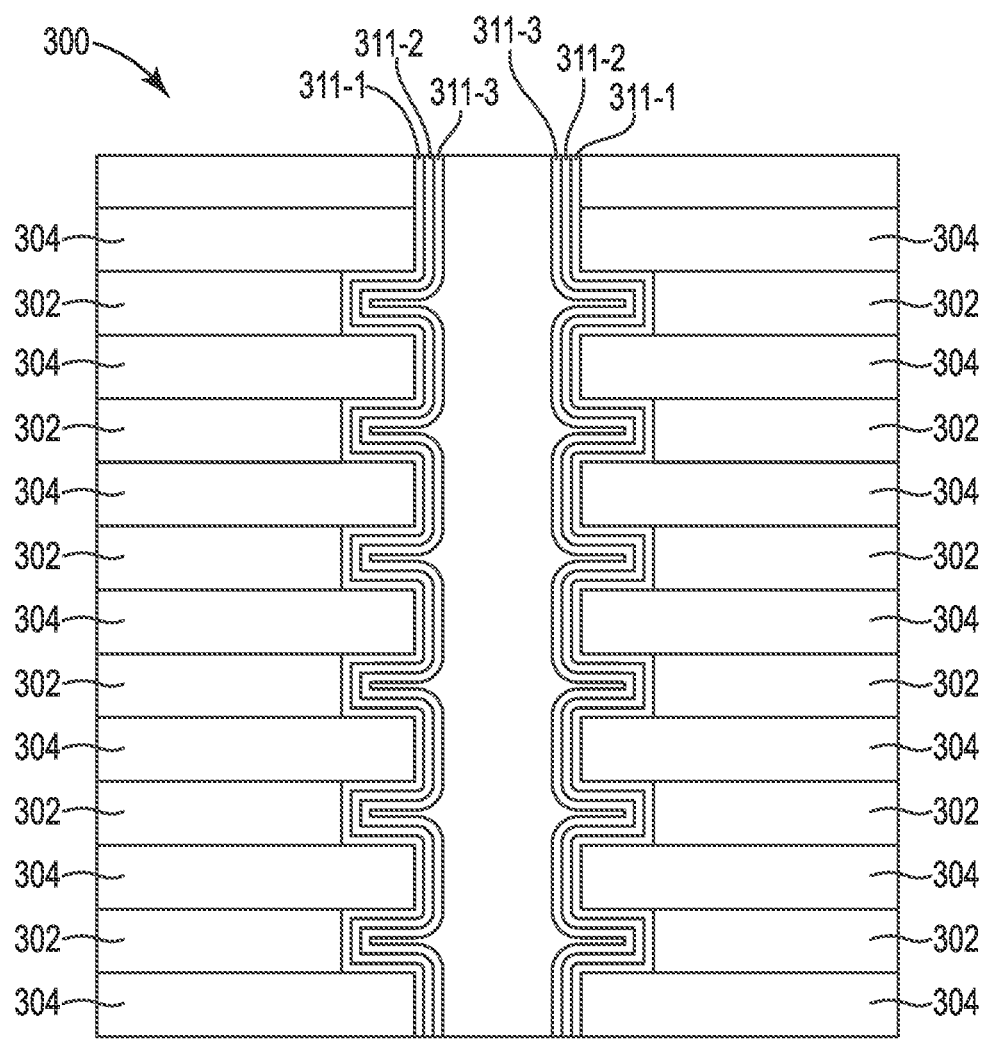
FIG. 3 illustrates a schematic cross-sectional view of a processing step in accordance with an embodiment of the present disclosure.

FIG. 3 illustrates a schematic cross-sectional view of a processing step in accordance with an embodiment of the present disclosure.

In a manner analogous to the array 100 previously described in connection with FIG. 1, the array 300 illustrated in FIG. 3 includes a conductive line material 302 which can be deposited in a plurality of planes vertically separated from one other by an insulation material 304. For instance, the insulation material 304 can be formed over an etch stop (e.g., substrate) material (not shown in FIG. 3), a first conductive line material 302 can then be formed on the insulation material, additional insulation material 304 can then be formed on the first conductive line, a second conductive line material 302 can then be formed on the insulation material that was formed on the first conductive line material, additional insulation material 304 can then be formed on the second conductive line material, and the formation of conductive line material 302 and insulation material 304 can continue in such an alternating manner.

As shown in FIG. 3, a plurality of recesses can be formed in the conductive material 302 in each of the planes. For example, a selective etching operation can be performed to form the plurality of recesses in an isotropic way. The etching chemistry can be selected such that the conductive material 302 is etched faster than the insulation material 304. The selective etching operation can be a dry etching operation or a wet etching operation. Single element materials 311 can be deposited (e.g., via ALD) in the openings in a manner analogous to that described in FIG. 1. The single element materials 311 can be formed in the plurality of recesses 315.

An etching operation, such as an etch-back operation can be performed subsequent to forming the single element materials 311 (previously described) so that surfaces of the single element materials 311 (e.g., the surfaces facing into the opening shown in FIG. 3) is/are approximately coplanar with surfaces of the insulation material 304 (e.g., the surfaces facing into the opening) as illustrated in FIG. 3. The etching operation can be a dry etching operation or a wet etching operation.

Figure 4:
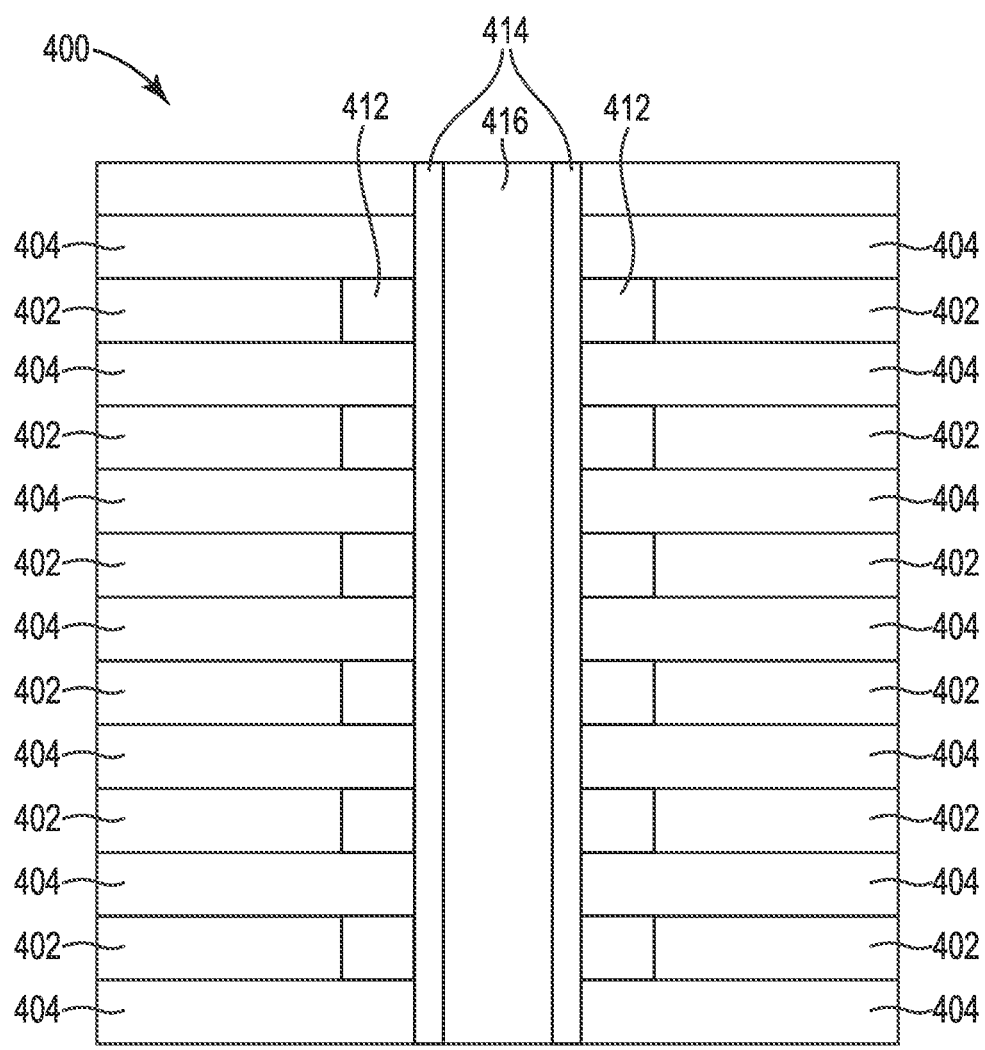
FIG. 4 illustrates a schematic cross-sectional view of a memory array in accordance with an embodiment of the present disclosure.

FIG. 4 illustrates a schematic cross-sectional view of a memory array (referred to as 400 in FIG. 4) in accordance with an embodiment of the present disclosure. For instance, FIG. 4 illustrates the array of FIG. 3 after the performance of an etching operation and an electrical forming process as described herein.

After etching, and in a manner analogous to that discussed above in connection with FIG. 2, a conductive cylinder (e.g., tube) 414 can be formed in each respective opening in contact with surfaces of the single element materials 311 illustrated in FIG. 3 (e.g., the surfaces facing into the opening shown in FIG. 3) that is/are approximately coplanar with surfaces of the insulation material 304 (e.g., the surfaces facing into the opening) as illustrated in FIG. 3. Then, a conductive extension 416 can be formed in each respective opening in contact with (e.g., over) the conductive cylinder 414 that was formed therein.

The array 400 can then undergo an electrical forming process to form a storage element 412 from the single element materials 311 illustrated in FIG. 3. Although FIG. 4 shows the storage element material 412 confined to the plurality of recesses, embodiments are not so limited. For example, during formation of the single element materials 411 and/or the storage element material 412 in the plurality of recesses, the storage element material 412 may be formed on the surfaces of the insulation material 404 facing into the opening.

As previously discussed, electrical forming can be performed on less than all stacks in the array 400. One or more stacks can be omitted in the electrical forming process. In a manner analogous to that shown in FIG. 2, these inactive stacks still retain the single element materials, rather than the storage element material 412, in the plurality of recesses. The inactive stack(s) may be located at a periphery and/or an edge of the array 400. In some embodiments, electrical forming may not be performed on any stacks located along an edge or a periphery of an array and those stacks may not be utilized as memory cells.

In some embodiments, electrical forming, may intermix the single element materials 311 to different extents based on location within the array 400 because electrical forming occurs (or occurs more) where current flows. For instance, in some embodiments, electrical forming may intermix the single element materials 311 only in active memory cell locations. In some embodiments, electrical forming may intermix the single element materials 311 more in active memory cell locations than in other locations (e.g., inactive locations). Stated differently, in regions adjacent to insulation material 404 the intermix may be less than in regions adjacent to conductive line material 402. As a result, the storage element material 412 may be more homogeneous in regions adjacent to the conductive line material (e.g., horizontal bit lines) 402 while it may remain, at least partially, as deposited single element materials 311 in regions adjacent to the insulation material (e.g., horizontal dielectric) 404.

It is again noted that the present disclosure is not limited to a particular architecture. For instance, some embodiments include a conventional 3D XPoint architecture array. A process of forming such an array can include depositing single element materials between a word line layer and a bit line layer at each deck and then defining each memory cell by a masked crossed-trench etch. Then, the forming process described herein can be performed on active cells/pillars. In some embodiments, the forming process may not be performed on the entire array (e.g., on inactive pillars, as described herein).

FIG. 5 illustrates a three dimensional memory array 500 in accordance with an embodiment of the present disclosure. Array 500 can be, for example, array 100, 200, 300, and/or 400 previously described in connection with FIGS. 1-4. That is, array 500 can be processed according to the processing steps previously described herein (e.g., in connection with FIGS. 1-4).

As shown in FIG. 5, access lines, which may be referred to as word lines (WLs), can be disposed on a plurality of levels (e.g., elevations, decks, planes). For example, word lines can be disposed on N levels. Insulation material (not shown in FIG. 6 for clarity and so as not to obscure embodiments of the present disclosure) can separate the levels of word lines. As such, the levels of word lines separated by insulation material can form a stack of WL/insulation materials. Further, as previously described herein, the word lines of each respective level can be divided into two sub-planes (e.g., an odd sub-plane and an even sub-plane), such that two (e.g., a pair) of word lines are created per level. However, embodiments of the present disclosure are not limited to two word lines per level.

Further, data lines, which may be referred to as bit lines (BLs), can be arranged substantially perpendicular to the word lines, and located at a level above the N levels of word lines (e.g., at the N+1 level). Each bit line can have a number of conductive extensions (e.g., vertical extensions) in proximity to the word lines, with a memory cell formed between the vertical extension and the word line.

For example, array 500 can include a plurality of conductive lines 502 (e.g., access lines), which may be referred to herein as word lines, and a plurality of conductive lines 524 (e.g., data lines), which may be referred to herein as bit lines. Word lines 502 can be arranged into a number of levels. Word lines 502 are shown being arranged into four levels in FIG. 5. However, the quantity of levels into which the word lines 502 can be arranged are not limited to this quantity, and word line 502 can be arranged into more, or fewer, levels. Word lines 502 are arranged substantially parallel one another within a particular level. The word lines 502 can be aligned vertically in a stack. For instance, word lines 502 in each of the multiple levels can be located at a same relative location within each level so as to be aligned with word lines 502 directly above and/or below. Insulation material 504 can be located between the levels at which word lines 502 are formed and between word lines 502 at a particular level.

As shown in FIG. 5, bit lines 524 can be arranged substantially parallel one another at a level different than the levels at which word lines 502 are located (e.g., above the levels at which word lines 502 are located). For instance, the bit lines can be located at the top of the memory array 500, as illustrated in FIG. 5. As an additional example, the bit lines can be located at the bottom of array 500. The bit lines 524 can be further arranged substantially perpendicular (e.g., orthogonal) to word lines 502 so as to have overlappings (e.g., crossings at different levels) therebetween. However, embodiments of the present disclosure are not limited to a strictly parallel/orthogonal configuration.

The indices shown for each word line 502 in FIG. 5 indicate the position (e.g., ordering) of the word lines within a particular level and the level. For example, word line $WL_{2,0}$ is shown being located at position 2 within level 0 (a word line at the bottom of a stack of word lines located at position 2), and word line $WL_{2,3}$ is shown being located at position 2 within level 3 (a word line at the top of a stack of word lines located at position 2). The quantity of levels into which the word lines 502 can be arranged, and the quantity of word lines 502 at each level can be more, or fewer, than the quantities shown in FIG. 5.

At each overlapping of a bit line 524 and a stack of word lines 502, a conductive extension 516 of the bit line 524 is oriented substantially perpendicular to the bit line 524 and the word lines 502, so as to intersect a portion of each word line 502 in the stack of word lines. For example, the conductive extension 516 of the bit line 524 can be arranged to extend vertically from the bit line 524 to intersect a portion the respective word lines 502 therebelow, as shown in FIG. 5. For instance, as one example, the conductive extension 516 can pass through a word line 502, so as to be surrounded entirely by the word line 502. According to an embodiment, the conductive extension 516 can pass near the word line 502 (e.g., adjacent), such that a memory cell 520 can be formed, as previously described herein. For example, FIG. 5 depicts one cell 520 at a crossing of conductive extension 516 and word line 502, although in some examples conductive extension 516 may be coupled to a pair of word lines (e.g., one even and one odd), as previously described herein.

Memory cells 520 are shown in FIG. 5 arranged in a three dimensional architecture near the location of where the conductive extension 516 of a bit line 524 and the word lines 502 are in proximity to one another at different levels. For example, a memory cell 520 can be located where a conductive extension 516 passes through a portion of a word line 502, as previously described herein.

As such, the memory cells 520 can be arranged in multiple levels, each level having memory cells at intersections of conductive extensions and word lines. The levels of memory cells 520 can be formed at different levels from one another, thereby being vertically stacked. Accordingly, memory array 500 can be a three dimensional memory array that includes include memory cells 520 having a common bit line 524, but separate word lines 502. For instance, each respective memory cell 520 can be substantially co-planar to its respective word line 502. Although four levels of word lines 502 (and four corresponding levels of memory cells 520) are shown in FIG. 5, embodiments of the present disclosure are not so limited and can include more, or fewer, levels of word lines 502 (and corresponding levels of memory cells 520). Memory cells may be formed substantially at the same levels as word lines are formed.

Some of memory cells 520 (e.g., active memory cells) may comprise a storage element material formed around each respective bit line 524 (e.g., a respective one of a first plurality of conductive extensions) while other memory cells 520 (e.g., inactive memory cells) may comprise a plurality of single element materials formed around each respective bit line 524 (e.g., a respective one of a second plurality of conductive extensions). In some embodiments, bit lines coupled to inactive memory cells may be located proximal to a periphery of the memory array.

Further, the memory cells 520 of memory array 500 can be coupled to decoder circuitry (not shown in FIG. 5). The decoder circuitry can be used to select a particular memory cell 520 during a program or sense operation, as will be further described herein (e.g., in connection with FIG. 6).

Figure 6:
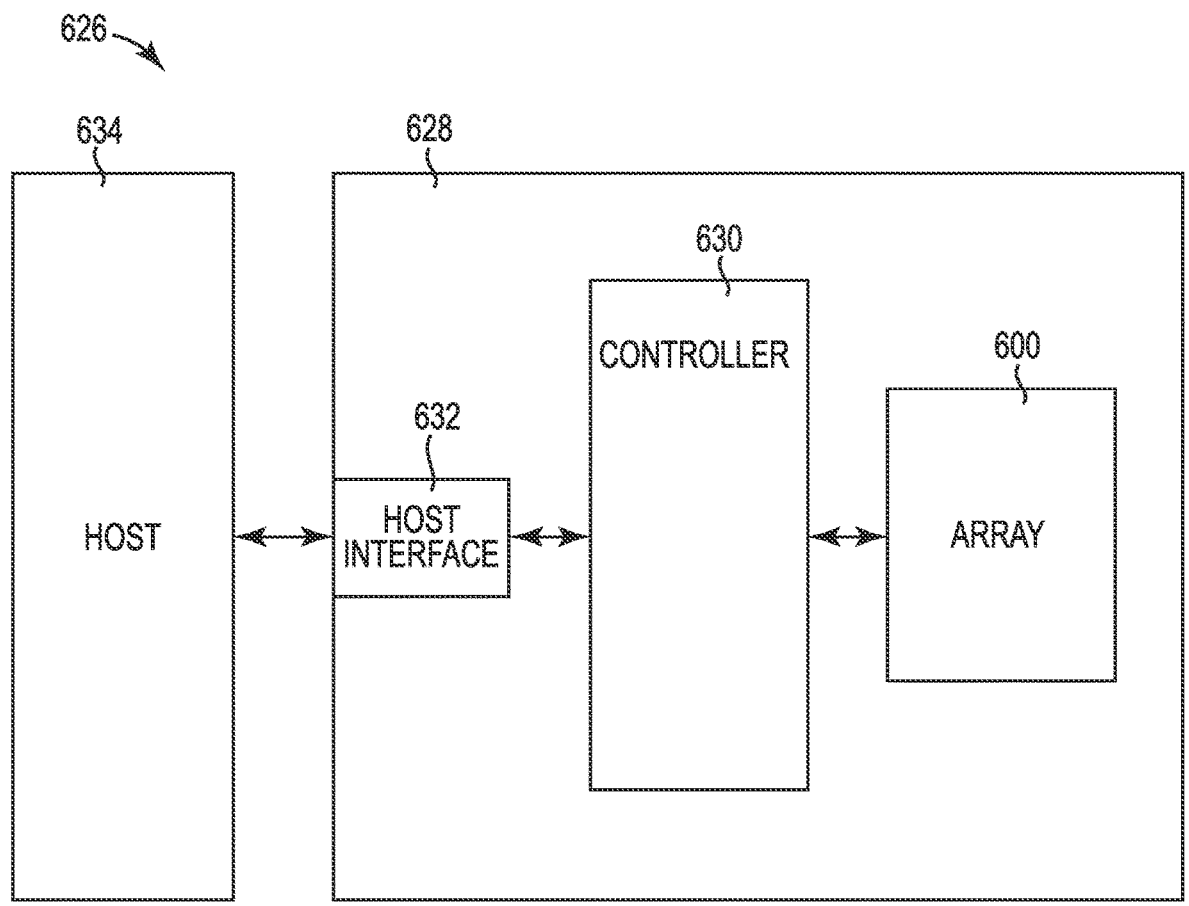
FIG. 6 is a block diagram of an apparatus in the form of a memory device in accordance with an embodiment of the present disclosure.

FIG. 6 is a block diagram of an apparatus in the form of a computing system 626 including an array 600 of memory cells having resistors in accordance with a number of embodiments of the present disclosure. As used herein, a memory system 628, a controller 630, or an array 600 might also be separately considered an "apparatus." The memory system 628 can be a solid state drive (SSD), for instance, and can include a host interface 632, a controller 630 (e.g., a sequencer and/or other control circuitry), and a number of memory arrays 600, which can be referred to as memory 600.

The controller 630 can be coupled to the host interface 632 and to the memory array 600 via a plurality of channels and can be used to transfer data between the memory system 628 and a host 634. The interface 632 can be in the form of a standardized interface. For example, when the memory system 628 is used for data storage in a computing system 626, the interface 632 can be a serial advanced technology attachment (SATA), peripheral component interconnect express (PCIe), or a universal serial bus (USB), among other connectors and interfaces. In general, however, the interface 632 can provide an interface for passing control, address, data, and other signals between the memory system 628 and a host 634 having compatible receptors for the interface 632.

Host 634 can be a host system such as a personal laptop computer, a desktop computer, a digital camera, a mobile telephone, or a memory card reader, among various other types of hosts. Host 634 can include a system motherboard and/or backplane and can include a number of processing resources (e.g., a number of processors).

The controller 630 can communicate with the memory array 600 (which in some embodiments can be a number of memory arrays on a single die) to control data read, write, and erase operations, among other operations. As an example, the controller 630 can be on a same die or a different die than a die or dice corresponding to memory array 600.

Although not specifically illustrated, the controller 630 can include a discrete memory channel controller for each channel coupling the controller 630 to the memory array 600. The controller 630 can include, for example, a number of components in the form of hardware and/or firmware and/or software for controlling access to the memory array 600 and/or for facilitating data transfer between the host 634 and memory array 600.

The memory array 600 can include a number of arrays of memory cells (e.g., non-volatile memory cells). The array 600 can be, for example, an array comprising cells formed in accordance with embodiments described herein. The array can be any array comprising one or more chalcogenide materials formed using an ALD process. The array 600 can be a 2D array. The array 600 can be a 3D memory array. As an example, the memory cells can be 3D cross point memory cells (e.g., 3D Xpoint) in which multiple tiers of cells are located at the intersections between orthogonal horizontal conductive lines (e.g., word lines and bit lines). The cells can comprise a chalcogenide switch and/or memory element material. In some instances, the memory cells can comprise a single chalcogenide material that can serve as a self-selecting memory element.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory array, comprising:
   a plurality of conductive lines separated from one another by an insulation material;
   a first plurality of conductive extensions arranged to extend substantially perpendicular to the plurality of conductive lines;
   a storage element material formed around each respective one of the first plurality of conductive extensions, the storage element material formed from a mixture of a plurality of single element materials;
   a second plurality of conductive extensions arranged to extend substantially perpendicular to the plurality of conductive lines; and
   the plurality of single element materials each concentrically formed around each respective one of the second plurality of conductive extensions.

2. The memory array of claim 1, wherein:
the memory array includes a conductive cylinder formed around each respective one of the first plurality of conductive extensions; and
the storage element material is formed around the conductive cylinder formed around each respective one of the first plurality of conductive extensions.

3. The memory array of claim 1, wherein the second plurality of conductive extensions are located proximal to a periphery of the memory array.

4. The memory array of claim 1, wherein the plurality of single element materials include at least two of: a selenium material, a tellurium material, a germanium material, an arsenic material, an indium material, an antimony material, and a silicon material.

5. The memory array of claim 1, wherein each of the plurality of single element materials is formed of a different thickness.

6. The memory array of claim 1, wherein the storage element material comprises a self-selecting chalcogenide material serving as a select element and a memory element.

7. The memory array of claim 1, wherein the storage element material is concentrically formed around each respective one of the conductive extensions in a square shape or circular shape.

8. The memory array of claim 1, wherein the storage element material is a chalcogenide material.

9. A three dimensional memory array, comprising:
a plurality of conductive lines separated from one another by an insulation material; and
a first plurality of vertical stacks, wherein each respective one of the first plurality of vertical stacks includes:
a conductive extension arranged to extend substantially perpendicular to the plurality of conductive lines; and
a storage element material formed around the conductive extension, the storage element material formed from a mixture of a plurality of single element materials;
a second plurality of vertical stacks, wherein each respective one of the second plurality of vertical stacks includes:
an inactive conductive extension arranged to extend substantially perpendicular to the plurality of conductive lines; and
the plurality of single element materials each concentrically formed around the inactive conductive extension.

10. The three dimensional memory array of claim 9, wherein each of the second plurality of vertical stacks are located along an edge of the memory array.

11. The three dimensional memory array of claim 9, wherein a composition of the storage element material is uniform.

12. The three dimensional memory array of claim 9, wherein a composition of the storage element material varies across a thickness of the storage element material.

13. The three dimensional memory array of claim 9, wherein the storage element material comprises at least one of: germanium telluride and indium telluride.

* * * * *